United States Patent
Li

(10) Patent No.: US 11,169,873 B2
(45) Date of Patent: Nov. 9, 2021

(54) METHOD AND SYSTEM FOR EXTENDING LIFESPAN AND ENHANCING THROUGHPUT IN A HIGH-DENSITY SOLID STATE DRIVE

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 30 days.

(21) Appl. No.: 16/418,602

(22) Filed: May 21, 2019

(65) Prior Publication Data

US 2020/0371871 A1    Nov. 26, 2020

(51) Int. Cl.
*G06F 11/00* (2006.01)
*G06F 11/10* (2006.01)
*G11C 29/52* (2006.01)
*H03M 13/29* (2006.01)
*H03M 13/15* (2006.01)

(52) U.S. Cl.
CPC .......... *G06F 11/1068* (2013.01); *G11C 29/52* (2013.01); *H03M 13/154* (2013.01); *H03M 13/2906* (2013.01)

(58) Field of Classification Search
CPC .. G06F 11/1068; G11C 29/52; H03M 13/154; H03M 13/29; H03M 13/2906; H03M 13/27; H03M 13/2957; G11B 20/1833
USPC ........................ 714/763, 764, 755, 758, 776
See application file for complete search history.

(56) References Cited

U.S. PATENT DOCUMENTS

| 3,893,071 A | 7/1975 | Bossen |
| 4,718,067 A | 1/1988 | Peters |
| 4,775,932 A | 10/1988 | Oxley |
| 5,394,382 A | 2/1995 | Hu |
| 5,732,093 A | 3/1998 | Huang |

(Continued)

FOREIGN PATENT DOCUMENTS

| JP | 2003022209 | 1/2003 |
| JP | 2011175422 | 9/2011 |

(Continued)

OTHER PUBLICATIONS

Tsuchiya, Yoshihiro et al. "DBLK: Deduplication for Primary Block Storage", MSST 2011, Denver, CO, May 23-27, 2011 pp. 1-5.

(Continued)

*Primary Examiner* — Albert Decady
*Assistant Examiner* — Osman M Alshack
(74) *Attorney, Agent, or Firm* — Shun Yao; Park, Vaughan, Fleming & Dowler LLP.

(57) ABSTRACT

One embodiment facilitates data placement in a storage device. During operation, the system receives a request indicating first data to be written to a non-volatile memory which includes a plurality of dies, wherein a plurality of error correction code (ECC) codec modules reside on the non-volatile memory. The system receives, by a first codec module residing on a first die, the first data. The system encodes, by the first codec module operating on the first die, the first data based on an error correction code (ECC) to obtain first ECC-encoded data which includes a first set of ECC parity bits. The system writes the first ECC-encoded data to the first die.

20 Claims, 12 Drawing Sheets

(56) References Cited

U.S. PATENT DOCUMENTS

| | | |
|---|---|---|
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,280,472 B1 | 3/2016 | Dang |
| 9,280,487 B2 | 3/2016 | Candelaria |
| 9,336,340 B1 | 5/2016 | Dong |
| 9,436,595 B1 | 9/2016 | Benitez |
| 9,529,601 B1 | 12/2016 | Dharmadhikari |
| 9,588,698 B1 | 3/2017 | Karamcheti |
| 9,588,977 B1 | 3/2017 | Wang |
| 9,747,202 B1 | 8/2017 | Shaharabany |
| 9,852,076 B1 | 12/2017 | Garg |
| 9,875,053 B2 | 1/2018 | Frid |
| 9,946,596 B2 * | 4/2018 | Hashimoto ......... H03M 13/293 |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,318,467 B2 | 6/2019 | Barzik |
| 10,361,722 B2 * | 7/2019 | Lee ................... H03M 13/1108 |
| 10,437,670 B1 | 10/2019 | Koltsidas |
| 10,649,657 B2 | 5/2020 | Zaidman |
| 2001/0032324 A1 | 10/2001 | Slaughter |
| 2002/0010783 A1 | 1/2002 | Primak |
| 2002/0073358 A1 | 6/2002 | Atkinson |
| 2002/0095403 A1 | 7/2002 | Chandrasekaran |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0156012 A1 | 7/2006 | Beeson |
| 2007/0033323 A1 | 2/2007 | Gorobets |
| 2007/0061502 A1 | 3/2007 | Lasser |
| 2007/0101096 A1 | 5/2007 | Gorobets |
| 2007/0283081 A1 | 12/2007 | Lasser |
| 2007/0285980 A1 | 12/2007 | Shimizu |
| 2008/0034154 A1 | 2/2008 | Lee |
| 2008/0065805 A1 | 3/2008 | Wu |
| 2008/0082731 A1 | 4/2008 | Karamcheti |
| 2008/0112238 A1 | 5/2008 | Kim |
| 2008/0301532 A1 | 12/2008 | Uchikawa |
| 2009/0089544 A1 | 4/2009 | Liu |
| 2009/0113219 A1 | 4/2009 | Aharonov |
| 2009/0177944 A1 * | 7/2009 | Kanno ................ G06F 11/1068 714/755 |
| 2009/0183052 A1 * | 7/2009 | Kanno ................ G06F 13/4068 714/763 |
| 2009/0282275 A1 | 11/2009 | Yermalayeu |
| 2009/0287956 A1 | 11/2009 | Flynn |
| 2009/0307249 A1 | 12/2009 | Koifman |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 * | 2/2011 | Uenaka ................ H01L 29/792 257/316 |
| 2011/0055458 A1 | 3/2011 | Kuehne |
| 2011/0055471 A1 | 3/2011 | Thatcher |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 * | 6/2011 | Selinger ............. G06F 11/1016 714/768 |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 * | 9/2011 | Kanno ................... G11C 29/52 714/756 |
| 2011/0258514 A1 | 10/2011 | Lasser |
| 2011/0292538 A1 | 12/2011 | Haga |
| 2011/0299317 A1 | 12/2011 | Shaeffer |
| 2011/0302353 A1 | 12/2011 | Confalonieri |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0159099 A1 | 6/2012 | Lindamood |
| 2012/0159289 A1 | 6/2012 | Piccirillo |
| 2012/0173792 A1 | 7/2012 | Lassa |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0331207 A1 * | 12/2012 | Lassa .................... G06F 1/3278 711/103 |
| 2013/0013880 A1 | 1/2013 | Tashiro |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0219131 A1 | 8/2013 | Nimrod |
| 2013/0238955 A1 | 9/2013 | D Abreu |
| 2013/0254622 A1 * | 9/2013 | Kanno ................... H03M 13/29 714/755 |
| 2013/0318283 A1 | 11/2013 | Small |

(56) References Cited

U.S. PATENT DOCUMENTS

| | | |
|---|---|---|
| 2013/0318395 A1 | 11/2013 | Kalavade |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0095827 A1 | 4/2014 | Wei |
| 2014/0108414 A1 | 4/2014 | Stillerman |
| 2014/0181532 A1 | 6/2014 | Camp |
| 2014/0195564 A1 | 7/2014 | Talagala |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0199234 A1* | 7/2015 | Choi ............... G11C 29/4401 |
| | | 714/764 |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0301964 A1 | 10/2015 | Brinicombe |
| 2015/0304108 A1 | 10/2015 | Obukhov |
| 2015/0347025 A1 | 12/2015 | Law |
| 2015/0363271 A1 | 12/2015 | Haustein |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048341 A1 | 2/2016 | Constantinescu |
| 2016/0077968 A1 | 3/2016 | Sela |
| 2016/0098344 A1 | 4/2016 | Gorobets |
| 2016/0098350 A1 | 4/2016 | Tang |
| 2016/0110254 A1 | 4/2016 | Cronie |
| 2016/0154601 A1 | 6/2016 | Chen |
| 2016/0155750 A1* | 6/2016 | Yasuda ............. H01L 29/40117 |
| | | 257/324 |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0321002 A1* | 11/2016 | Jung ................ G06F 3/0605 |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1* | 9/2017 | Sunwoo ............. G06F 11/1044 |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1* | 3/2018 | Oh ............................ G11C 8/12 |
| 2018/0088867 A1 | 3/2018 | Kaminaga |
| 2018/0107591 A1 | 4/2018 | Smith |
| 2018/0143780 A1 | 5/2018 | Cho |
| 2018/0150640 A1 | 5/2018 | Li |
| 2018/0167268 A1 | 6/2018 | Liguori |
| 2018/0173620 A1 | 6/2018 | Cen |
| 2018/0189182 A1 | 7/2018 | Wang |
| 2018/0212951 A1 | 7/2018 | Goodrum |
| 2018/0232151 A1 | 8/2018 | Badam |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0329776 A1 | 11/2018 | Lai |
| 2018/0349396 A1 | 12/2018 | Blagojevic |
| 2018/0356992 A1 | 12/2018 | Lamberts |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0073262 A1 | 3/2019 | Chen |
| 2019/0087115 A1 | 3/2019 | Li |
| 2019/0171532 A1 | 6/2019 | Abadi |
| 2019/0205206 A1 | 7/2019 | Hornung |
| 2019/0227927 A1 | 7/2019 | Miao |
| 2019/0272242 A1 | 9/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0097189 A1 | 3/2020 | Tao |

FOREIGN PATENT DOCUMENTS

| | | |
|---|---|---|
| WO | 9418634 | 8/1994 |
| WO | 1994018634 | 8/1994 |

OTHER PUBLICATIONS

Chen Feng, et al. "CAFTL: A Content-Aware Flash Translation Layer Enhancing the Lifespan of Flash Memory based Solid State Devices"<FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

(56) References Cited

OTHER PUBLICATIONS

EMC Powerpath Load Balancing and Failover Comparison with native MPIO operating system solutions. Feb. 2011.

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime," Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

\* cited by examiner

METHOD AND SYSTEM FOR EXTENDING LIFESPAN AND ENHANCING THROUGHPUT IN A HIGH-DENSITY SOLID STATE DRIVE

BACKGROUND

Field

This disclosure is generally related to the field of data storage. More specifically, this disclosure is related to a method and system for extending lifespan and enhancing throughput in a high-density solid state drive using an on-chip error correction coding (ECC) codec.

Related Art

The proliferation of the Internet and e-commerce continues to create a vast amount of digital content. Various distributed storage systems have been created to access and store such digital content. A storage system can include volatile memory (e.g., dynamic random access memory (DRAM)) and multiple drives (e.g., a solid state drive (SSD) or a hard disk drive (HDD)) with non-volatile memory (e.g., Not-And (NAND) flash memory in an SSD). NAND flash memory can store a certain number of bits per cell. For example: a multi-level cell (MLC) memory element can store two bits of information per cell, and four levels per cell; a triple-level cell (TLC) memory element can store three bits of information per cell, and eight levels per cell; and a quad-level cell (QLC) memory element can store four bits of information per cell, and 16 levels per cell.

As the number of bits per cell increases, so decreases the cost of the associated SSD as well as the endurance. For example, as the density and capacity of memory elements continues to increase (e.g., three-dimensional (3D) stacking and inserting more bits in one NAND cell, such as QLC NAND), the process variation of current NAND memory may result in a decreased endurance and a shortened lifespan. That is, the endurance and lifespan of high-density NAND (e.g., QLC NAND) flash may be much lower and shorter than that of TLC/MLC.

In addition, a controller in an SSD generally includes an error correction coding (ECC) codec (e.g., encoder and decoder). As both the capacity of SSDs and the density of NAND flash increase, the single ECC codec residing in the SSD controller may result in congestion or a bottleneck. For example, when the number of NAND channels increases, each ECC codec must serve more clients. Furthermore, the increased usage of high-density NAND may result in a high raw error rate. As an example, QLC NAND flash may inherently possess a higher raw error rate as compared to TLC/MLC NAND flash. The higher raw error rate can result in an increased burden on the single shared ECC codec in the controller. The system may thus be required to enter the retry state more frequently, which may require a longer time to decode more codewords. These challenges may result in a decreased performance of the overall storage system, including a Quality of Service (QoS) instability.

Thus, while high-density NAND (such as QLC NAND) can provide a cost-effective solution, some challenges remain in extending the lifespan and enhancing the throughput of these high-density storage drives.

SUMMARY

One embodiment facilitates data placement in a storage device. During operation, the system receives a request indicating first data to be written to a non-volatile memory which includes a plurality of dies, wherein a plurality of error correction code (ECC) codec modules reside on the non-volatile memory. The system receives, by a first codec module residing on a first die, the first data. The system encodes, by the first codec module operating on the first die, the first data based on an error correction code (ECC) to obtain first ECC-encoded data which includes a first set of ECC parity bits. The system writes the first ECC-encoded data to the first die.

In some embodiments, the system encodes, by an erasure coding module of a controller of the storage device, the first data and other data to be written to the non-volatile memory based on an erasure code (EC) to obtain second data which comprises EC parity bits. The system receives, by a second codec module residing on a second die, the second data. The system encodes, by the second codec module operating on the second die, the second data based on the error correction code (ECC) to obtain second ECC-encoded data which includes a second set of ECC parity bits. The system writes the second ECC-encoded data to the second die.

In some embodiments, the first data and the other data comprise a superblock of the non-volatile memory.

In some embodiments, the system receives a request to read the first data from the non-volatile memory. The system retrieves, from the first die, the first ECC-encoded data. The system decodes, by the first codec module, the retrieved first ECC-encoded data based on the error correction code (ECC) to obtain first ECC-decoded data which includes the first set of ECC parity bits. The system drops the first set of ECC parity bits to obtain the first data. The system returns the first data.

In some embodiments, in response to detecting an error in decoding the retrieved first ECC-encoded data, the system: retrieves, from the second die, the second ECC-encoded data; decodes, by the second codec module, the retrieved second ECC-encoded data based on the error correction code (ECC) to obtain second ECC-decoded data which includes the second set of ECC parity bits; drops the second set of ECC parity bits to obtain the second data which comprises the EC parity bits; and decodes, by the erasure coding module of the controller, the EC parity bits based on the erasure code (EC) to obtain the first data and the other data.

In some embodiments, the storage device comprises a plurality of channels, a respective channel is associated with a respective die, and the first codec module receives the first data via a first channel associated with the first die.

In some embodiments, a respective die comprises a NAND flash memory element and further comprises: a plurality of layers, including a peripheral layer stacked above a remainder of the plurality of layers, wherein a respective codec module resides on the peripheral layer, and wherein the remainder layers form a staircase-shape which routes wordlines to the peripheral layer and the respective codec module.

In some embodiments, an entity other than a controller of the storage device performs the following operations: wear-leveling; garbage-collection; addressing-mapping; and bad block management. The entity other than the controller of the storage device is a host or a host application.

In some embodiments, a respective codec module resides on a respective die or dies.

BRIEF DESCRIPTION OF THE FIGURES

In the figures, like reference numerals refer to the same figure elements.

DETAILED DESCRIPTION

Figure 1:
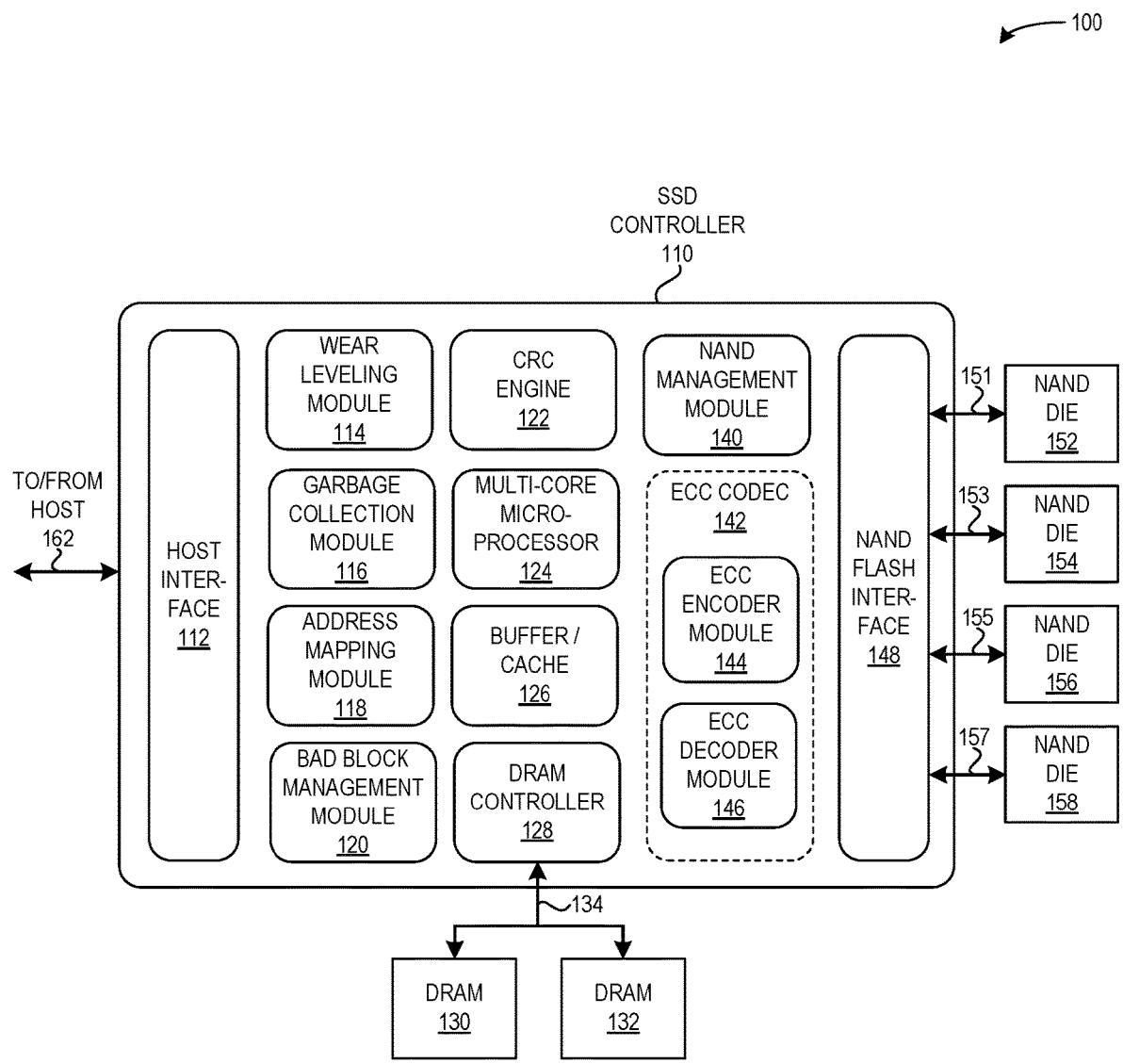
FIG. 1 illustrates an exemplary environment for facilitating data placement in a storage device, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of extending the lifespan and enhancing the throughput of high-density storage drives by placing an error correction code (ECC) codec module on each of a plurality of dies of a storage drive, thereby eliminating the bottleneck in traffic resulting from a single shared ECC codec in the storage drive's controller being responsible for performing ECC-encoding and ECC-decoding across multiple dies.

As described above, as the number of bits per cell increases, so decreases the cost of the associated SSD as well as the endurance. For example, as the density and capacity of memory elements continues to increase (e.g., 3D stacking and inserting more bits in one NAND cell, such as QLC NAND), the process variation of current NAND memory may result in a decreased endurance and a shortened lifespan. That is, the endurance and lifespan of high-density NAND (e.g., QLC NAND) flash may be much lower and shorter than that of TLC/MLC.

In addition, a controller in an SSD generally includes an error correction coding (ECC) codec (e.g., encoder and decoder). As both the capacity of SSDs and the density of NAND flash increase, the single ECC codec residing in the SSD controller may result in congestion or a bottleneck. For example, when the number of NAND channels increases, each ECC codec must serve more clients. Furthermore, the increased usage of high-density NAND may result in a high raw error rate. As an example, QLC NAND flash may inherently possess a higher raw error rate as compared to TLC/MLC NAND flash. The higher raw error rate can result in an increased burden on the single shared ECC codec in the controller. The system may thus be required to enter the retry state more frequently, which may require a longer time to decode more codewords. These challenges may result in a decreased performance of the overall storage system, including a Quality of Service (QoS) instability.

Thus, while high-density NAND (such as QLC NAND) can provide a cost-effective solution, some challenges remain in extending the lifespan and enhancing the throughput of these high-density storage drives.

The embodiments described herein address these challenges by providing a system in which an individual ECC codec module resides on each of a plurality of NAND dies, as described below in relation to FIG. 2. By placing the ECC codec module and associated operations "on-chip," the system eliminates the bottleneck which results from the conventional method of having a single shared ECC codec in the controller perform the ECC operations across all of the dies.

Specifically, by placing the ECC codec into each individual NAND die, the system can reduce the congestion at the controller resulting from ECC-encoding and ECC-decoding every block or chunk of user data to be stored in non-volatile memory. Furthermore, the embodiments described herein place an erasure coding (EC) codec or module into the controller (which allows the EC codec to be shared across multiple channels, as described below in relation to FIG. 6), and also move various conventional operations (such as wear-leveling, garbage collection, address mapping, and bad block management) to the host-side, as described below in relation to FIG. 2.

Thus, the individual ECC codecs residing on NAND dies across multiple channels can collaborate with the EC codec in the controller of a single storage drive to achieve an improved self-correction noise immunity for the high-density high-capacity NAND, which results in an increased lifespan and an enhanced throughput for the NAND memory.

A "storage drive" refers to a device or a drive with a non-volatile memory which can provide persistent storage of data, e.g., a solid state drive (SSD) or a hard disk drive (HDD).

A "storage server" refers to a computing device which can include multiple storage drives. A distributed storage system can include multiple storage servers.

A "codec" refers to a module which performs both encoding and decoding. For example, an error correction code (ECC) codec performs both ECC encoding and ECC decoding, and an erasure code (EC) codec performs both EC encoding and EC decoding. The terms "codec," "module," and "codec module" are used interchangeably in this disclosure.

NAND flash memory can store a certain number of bits per cell. For example: a "single-level cell" or "SLC" memory element can store one bit of information per cell; a "multi-level cell" or "MLC" memory element can store two bits of information per cell; a "triple-level cell" or "TLC" memory element can store three bits of information per cell; and a "quad-level cell" or "QLC" memory element can store four bits of information per cell.

Exemplary Environment for Data Placement in the Prior Art

FIG. 1 illustrates an exemplary environment 100 for facilitating data placement in a storage device, in accordance with the prior art. In this conventional environment 100, the ECC codec can be made more powerful and the workload can be regulated with a sequential read/write. Environment 100 can include an SSD controller 110 which can communicate with a host via a to/from host 162 communication. SSD controller 110 can also include: a host interface 112 for communicating with the host; a wear leveling module 114; a garbage collection module 116; an address mapping module 118; a bad block management module 120; a cyclic redundancy check (CRC) engine 122; a multi-core microprocessor 124; a buffer/cache 126; a DRAM controller 128, which can manage and access DRAMs 130 and 132 (via a communication 134); a NAND management module 140; an error correction coding (ECC) codec 142; and a NAND flash interface 148 for communicating with NAND flash memory (e.g., NAND dies 152, 154, 156, and 158 over, respectively, channels 151, 153, 155, and 157.

Modules 114, 116, 118, and 120 may be implemented via firmware running on multi-core microprocessor 124. Back-end firmware can also handle NAND management (e.g., module 140) and ECC-related operations (e.g., as performed by ECC codec 142). ECC codec 142 can include both ECC encoder module 144 and ECC decoder module 146. ECC codec 142 is shared among multiple NAND channels (e.g., channels 151, 153, 155, and 157). To avoid congestion at ECC codec 142, conventional SSD controller 110 may be designed with a strong ECC code in order to handle the increased raw error rate from the high-density NAND. However, in order to also obtain high performance, conventional SSD controller 110 may be implemented with an increased number of NAND channels, and the increased throughput from this increased number of NAND channels can result in an increased burden on ECC codec 142. As NAND cells age, the congestion resulting from the ECC codec can become more and more obvious, and can adversely affect the lifespan of the SSD. The ECC codec congestion can also harm the overall performance of the SSD.

Exemplary Environment for Facilitating Data Placement Using On-Chip ECC Codec Per Each NAND Die The embodiments described herein address the challenges of conventional environment 100 and conventional SSD controller 110 of FIG. 1, by offloading the data-intensive ECC codec to each NAND flash, which can result in, e.g., saved capacity/area, increased stability in throughput, and more efficient noise immunity.

Figure 2:
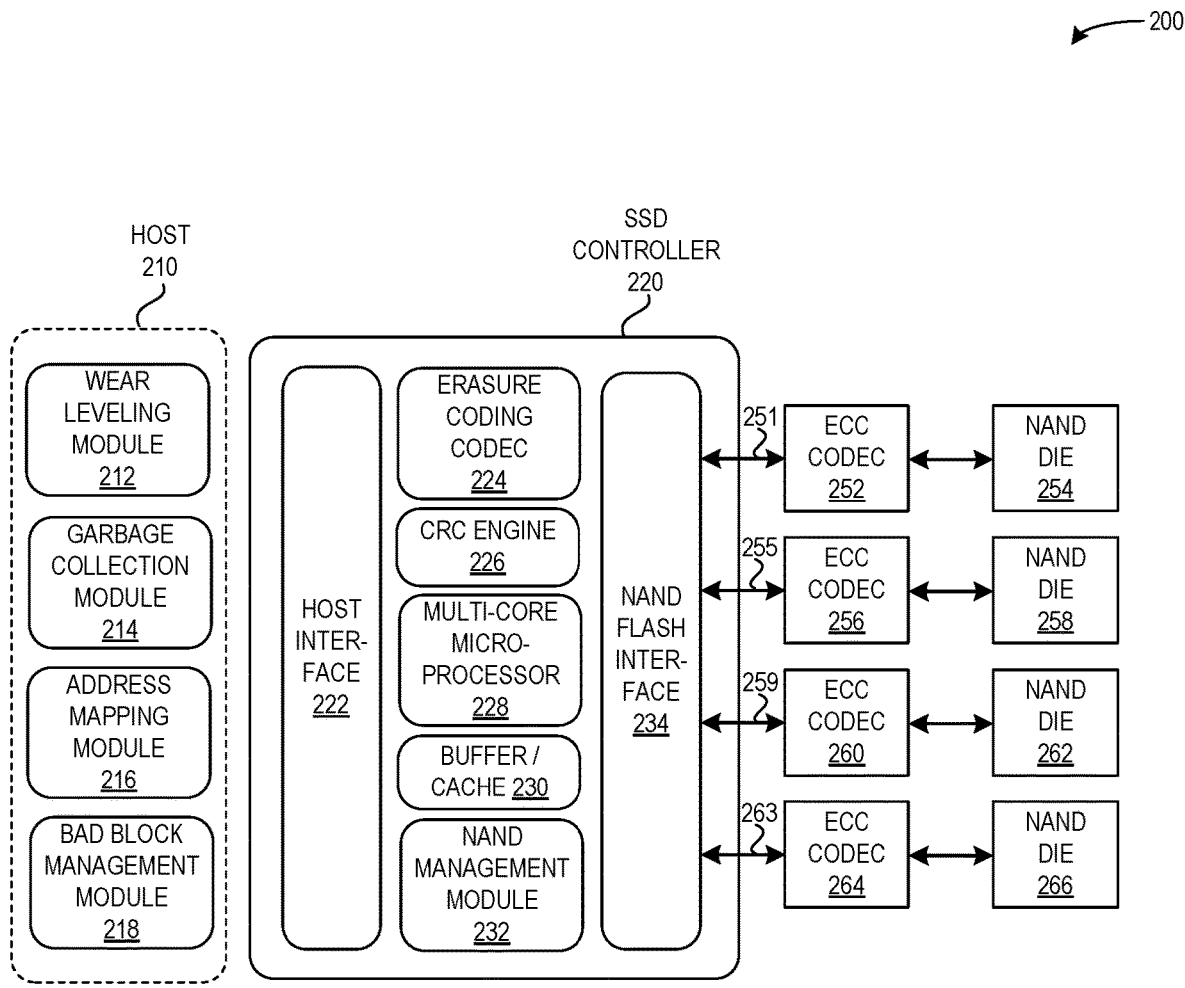
FIG. 2 illustrates an exemplary environment for facilitating data placement in a storage device, in accordance with an embodiment of the present application.

FIG. 2 illustrates an exemplary environment 200 for facilitating data placement in a storage device, in accordance with an embodiment of the present application. Environment 200 can include a host 210, an SSD controller 220, and an individual ECC codec module residing on each respective NAND die. Host 210 can include: a wear leveling module 212; a garbage collection module 214; an address mapping module 216; and a bad block management module 218. SSD controller 220 can include: a host interface 222 for communicating with the host; an erasure coding (EC) codec 224; a CRC engine 226; a multi-core microprocessor 228; a buffer/cache 230; a NAND management module 232; and a NAND flash interface 234 for communicating with NAND flash memory.

In environment 200, SSD controller 220 can communicate with NAND flash memory (e.g., NAND dies 254, 258, 262, and 266 over, respectively, channels 251, 255, 259, and 263. Furthermore, environment 200 can include an individual ECC codec residing on each NAND flash memory element: an ECC codec 252 can reside on NAND die 254; an ECC codec 256 can reside on NAND die 258; an ECC codec 260 can reside on NAND die 262; and an ECC codec 264 can reside on NAND die 266. Note that while channels 251-263 are depicted as occurring between NAND flash interface 234 and each respective ECC codec (e.g., 252-264), each individual ECC codec may reside on its respective NAND die.

By moving the ECC codec to the other side of the NAND interface, such that each ECC codec sits between NAND flash interface 234 and NAND dies 254-266, environment 200 allows each NAND channel to have its own ECC codec, which eliminates the need to share a single ECC codec across or among multiple NAND channels (as in conventional environment 100). This results in eliminating the bottleneck created by relying upon a single ECC codec across multiple NAND channels in a high-density NAND, which can extend the lifespan and enhance the throughput of the high-density storage drives.

In the embodiments described here, a single erasure coding (EC) codec (e.g., EC codec 224) may be used across multiple channels to consolidate the data consistency in addition to the on-chip ECC protection, as described below in relation to FIG. 5. Furthermore, in environment 200, certain conventional SSD controller operations may be implemented on the host side, by host 210. For example, the system can use the more powerful host CPU and host DRAM to perform the conventionally firmware-implemented functions, such as wear leveling, garbage collection, address mapping, and bad block management (i.e., modules 212-218). In addition, when the status, data, and instructions are held/stored/processed using the resources of the host DRAM, SSD controller 220 no longer requires a DRAM controller and associated DRAMS (e.g., DRAM controller 128 and DRAMs 130 and 132 of FIG. 1).

Thus, in the embodiments described herein, the system simplifies controller 220 by moving SSD management-related operations to the host side and by moving the ECC codec to the NAND flash (individually, per each respective NAND die, as in the above described manner). In some embodiments, the ECC codec in the NAND can reside on or be shared by two or more dies. As shown in environment 200, the system can eliminate the congestion caused by the conventional single ECC codec across multiple NAND channels, and thus result in an improved lifespan and throughput in high-density storage drives.

Exemplary Layers of a NAND Die and Placement of On-Chip ECC Codec

Figure 3:
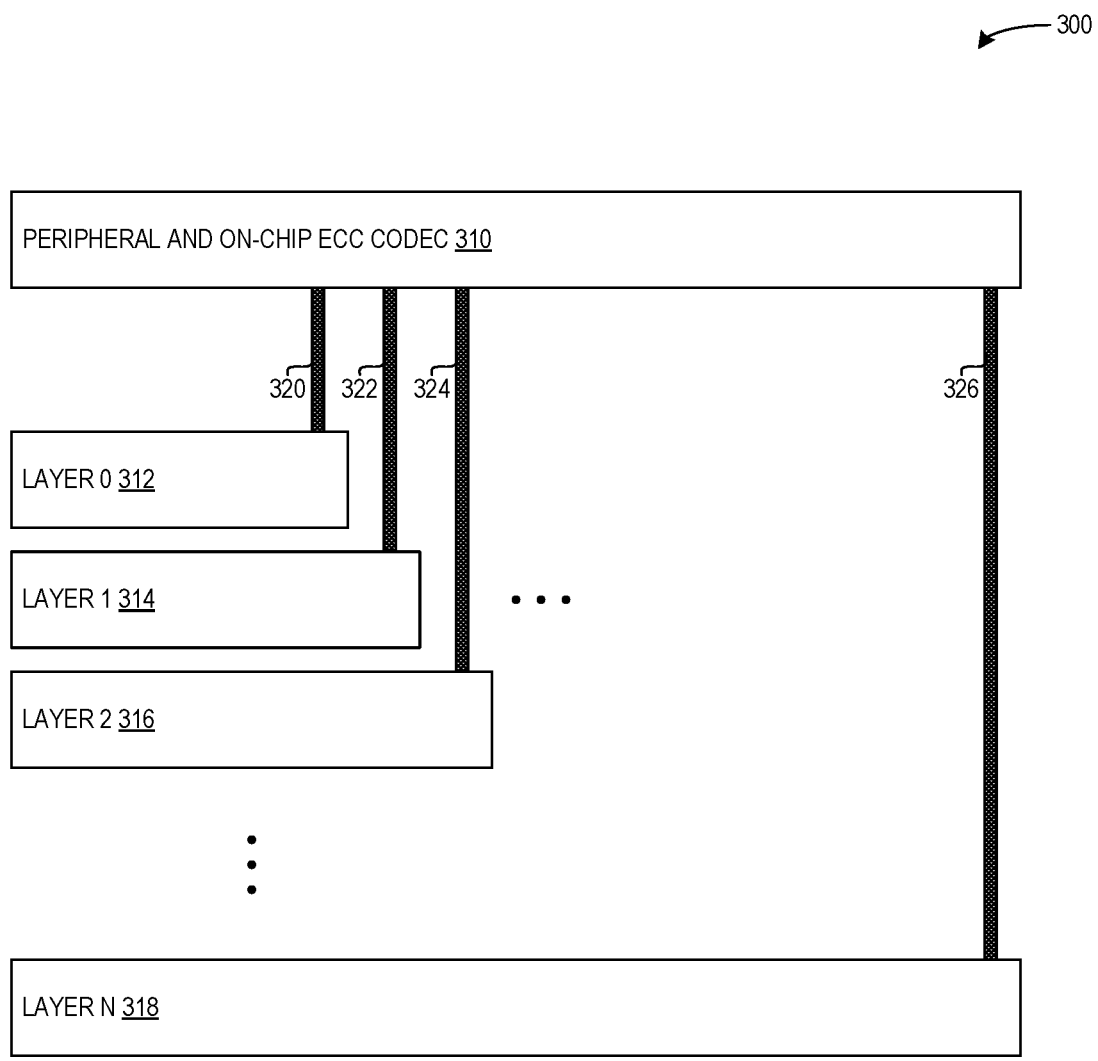
FIG. 3 illustrates an exemplary diagram of multiple layers in a NAND memory element, where an on-chip ECC codec resides on the NAND memory element, in accordance with an embodiment of the present application.

In three-dimensional (3D) NAND flash, peripheral circuits may be stacked vertically with the memory array. In the embodiments described herein, the system can make use of the sufficient on-chip area to fabricate the individual ECC codec which resides on the NAND die. FIG. 3 illustrates an exemplary diagram 300 of multiple layers in a NAND memory element, where an on-chip ECC codec resides on the NAND memory element, in accordance with an embodiment of the present application. Diagram 300 can include a peripheral and on-chip ECC codec 310, which is vertically stacked on multiple layers of the 3D NAND. The NAND layers can include: a layer 0 312; a layer 1 314, a layer 2 316; and a layer N 318. These NAND layers can form a staircase-like shape to route the wordlines (via, e.g., communications 320, 322, 324, and 326) to the peripheral circuits and the on-chip ECC codec of layer 310.

In a conventional SSD controller, the conventional ECC codec is typically limited by the constraint of the SSD System on Chip's (SoC) area, power, floorplan, and routing. Thus, the limited number of ECC codecs which may be equipped on a conventional SSD controller can exacerbate the challenges resulting from the ECC encoding/decoding congestion. In contrast, when the ECC codec is moved into the 3D NAND's peripheral layer (as in diagram 300 of FIG. 3), there exists adequate space for the floorplan, placing, and routing. Although fewer metal layers may be allowed in this NAND fabrication technology, the relaxation on the area requirements allows for competent handling of the on-chip ECC codec.

Figure 4:
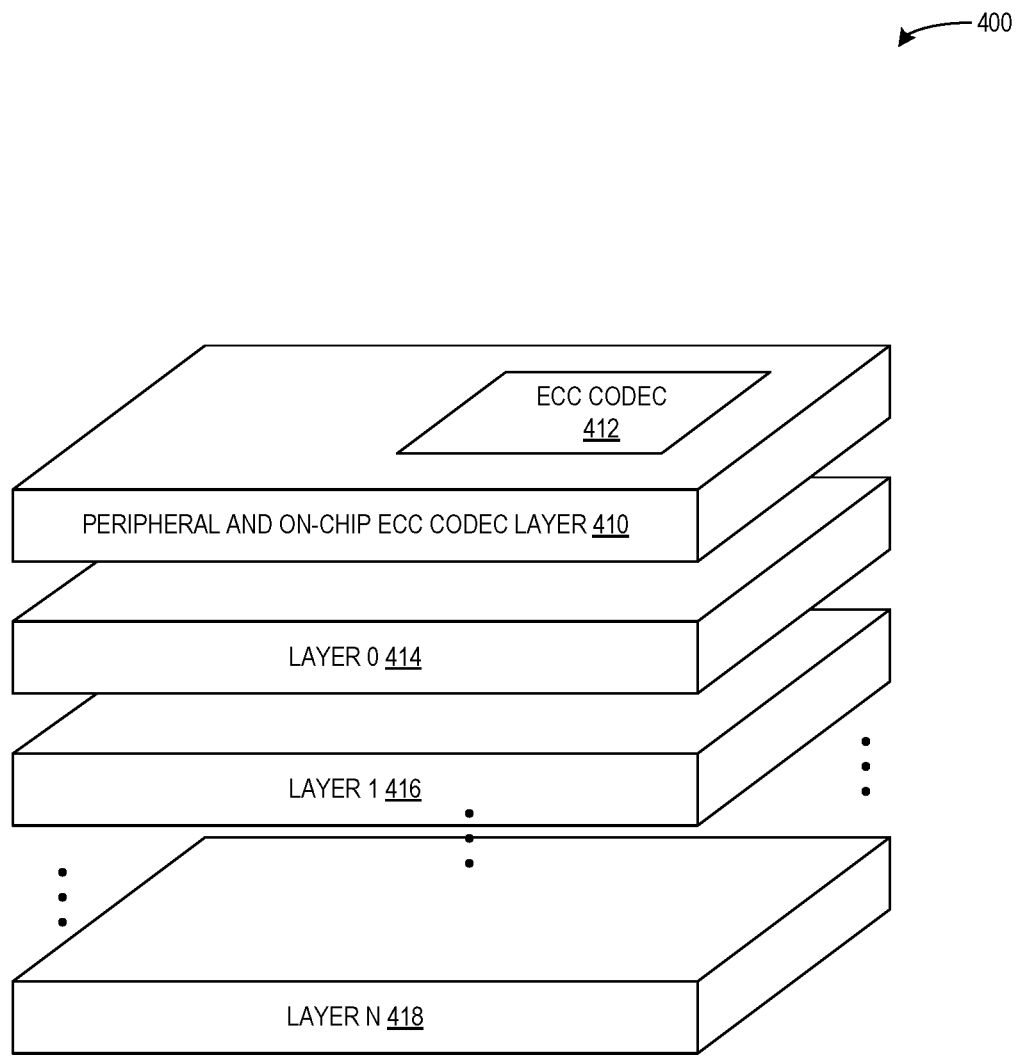
FIG. 4 illustrates an exemplary diagram of multiple layers in a NAND memory element, where an on-chip ECC codec resides on the NAND memory element, in accordance with an embodiment of the present application.

FIG. 4 illustrates an exemplary diagram 400 of multiple layers in a NAND memory element, where an on-chip ECC codec resides on the NAND memory element, in accordance with an embodiment of the present application. In diagram 400, the ECC codec is depicted as being implemented in the peripheral layer which is aligned with the high-density NAND layers. Diagram 400 can include: a peripheral and on-chip ECC codec layer 410, which includes an ECC codec 412; a layer 0 414; a layer 1 416; and a layer N 418. Because the peripheral circuit can be relatively simple and straightforward (as compared to high-density high-capacity NAND layers 414, 416, and 418), a majority of peripheral layer 410 is not used. The system can thus utilize this previously unused space for the on-chip ECC codec (e.g., ECC codec 412).

In addition, when implementing the on-chip ECC codec in the NAND flash in the manner described herein, the SSD controller no longer has visibility into the data domain, which is now fully handled by the NAND flash itself. The amount of data transferred through the NAND flash interface is also significantly reduced, as the data-intensive ECC encoding and decoding operations and related processing can now be performed much closer to the storage of the data itself, which results in a significant reduction in the cost of data transfer.

Exemplary Format of Data and NAND Memory Element/Unit

Figure 5A:
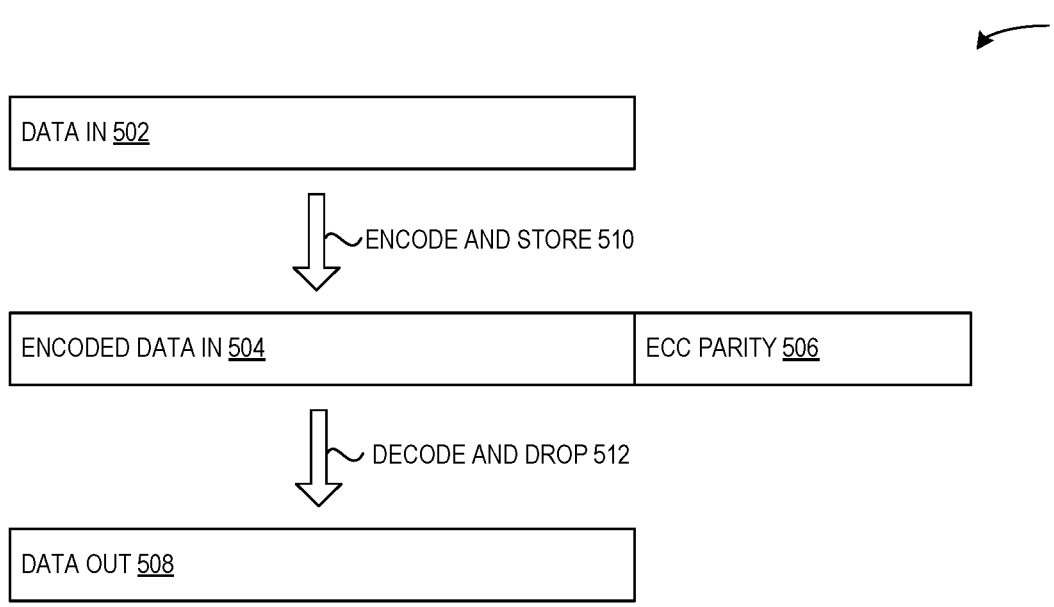
FIG. 5A illustrates an exemplary format for data in a write operation and a read operation, in accordance with an embodiment of the present application.

FIG. 5A illustrates an exemplary format 500 for data in a write operation and a read operation, in accordance with an embodiment of the present application. In a write operation, given data in 502, the system can perform an encode and store 510 function (e.g., by an individual on-chip ECC codec), which can result in storing encoded data in 504 and its corresponding ECC parity 506 on the NAND die or flash memory element on which the on-chip ECC codec resides. In a read operation, the system can retrieve encoded data in 504 and ECC parity 506 from the NAND die, and perform a decode and drop 512 function (e.g., by the individual on-chip ECC codec residing on the NAND die), which can result in returning data out 508 to a requesting host or other application.

Figure 5B:
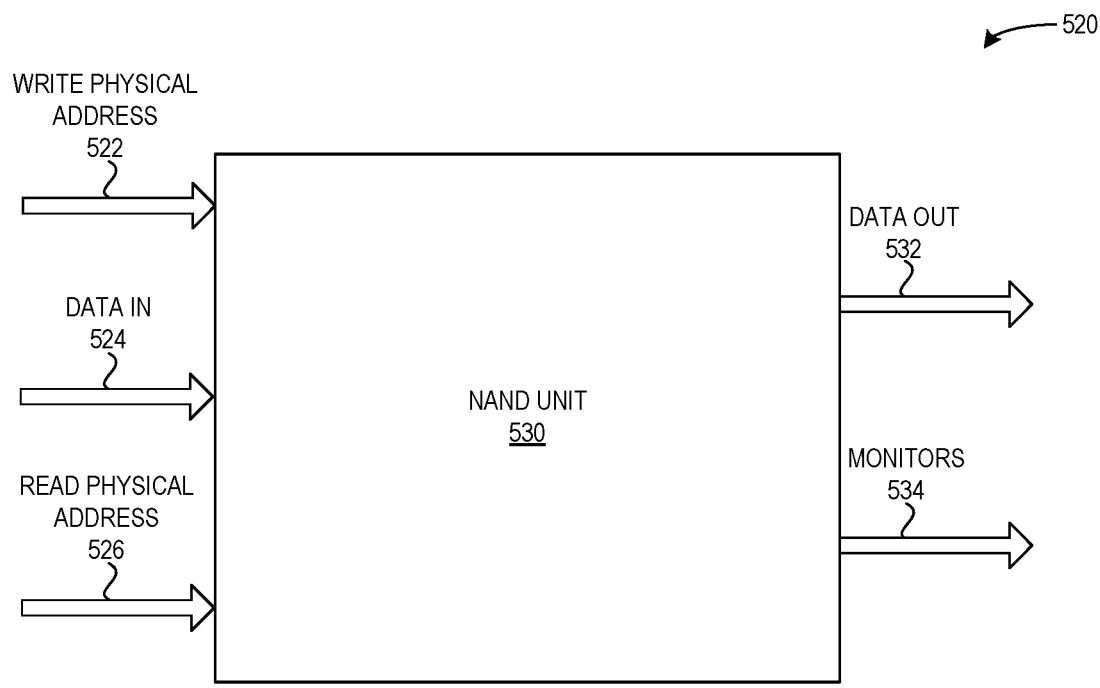
FIG. 5B illustrates an exemplary NAND memory element, in accordance with an embodiment of the present application.

FIG. 5B illustrates an exemplary NAND memory element 520, in accordance with an embodiment of the present application. NAND memory element 520 can comprise a standalone NAND unit 530 with its internal on-chip ECC codec (not shown) which can accomplish the necessary self-correction. The NAND interface (e.g., NAND flash interface 234 of FIG. 2) can be simple and straightforward. The SSD controller can send, via the NAND interface to the NAND unit and its corresponding ECC codec, only the data to be written into the NAND unit itself, where the NAND unit handles the associated data processing for protection and storage. For example, during a write operation: the system issues a write physical address 522; the data to be written is sent to NAND unit 530 as data in 524 along with write physical address 522; and the data is encoded by the on-chip ECC codec and stored, along with the ECC parity, at write physical address 522 of NAND unit 530 (as described above in relation to FIGS. 2 and 5A).

During a read operation: the system issues the physical address from which to read the data (e.g., a read physical address 526); the data is retrieved from read physical address of NAND unit 530; and the data is returned as data out 532 after being decoded by the on-chip ECC codec and dropping the ECC parity (as described above in relation to FIGS. 2 and 5A). Thus, only the user data which was previously received from the controller is sent back out to the NAND interface (e.g., as data out 532).

Furthermore, NAND unit 530 can monitor and generate information related to the health condition of NAND unit 530, and can transmit this generated information out as monitors 534. This information can also be related to the quality of the data, and can include, e.g.: the raw error rate of the NAND unit; the amount of time spent on encoding or decoding data, a codeword, or other unit of data; the average amount of time spent on encoding or decoding data; the number of iterations spent to encode or decode data; whether the encoding was based on ECC or EC. This monitored information 534 can be used by another module (such as a flash translation layer (FTL) module or a host) to operate, e.g., wear leveling, garbage collection, moving data from one physical location to another, and address mapping and re-mapping.

Erasure Coding Across Multiple Channels

A higher possibility of die failure or read error may occur in high-density NAND (e.g., QLC NAND), as compared to, e.g., TLC/MLC NAND. Thus, the conventional XOR or RAID that can typically only tolerate one or two failures cannot provide sufficient error recovery to match these characteristics of high-density NAND. In the embodiments described herein, by moving the SSD management to the host and by moving the ECC codec to the individual on-chip design, the SSD controller can implement the more complicated erasure coding without creating a bottleneck or additional congestion. If multiple dies fail or are unresponsive due to an erase cycle in the NAND flash, the erasure coding module in the controller can still recover the data without resulting in queuing or congestion. Recall that EC decoding is triggered only in the occurrence of errors, while ECC decoding is necessary for every chunk of data read out from the NAND flash. This allows the erasure coding to be shared by and across multiple channels without resulting in the same bottleneck or congestion previously caused by the single ECC codec of the conventional SSD controller (e.g., ECC codec 142 of FIG. 1).

Figure 6:
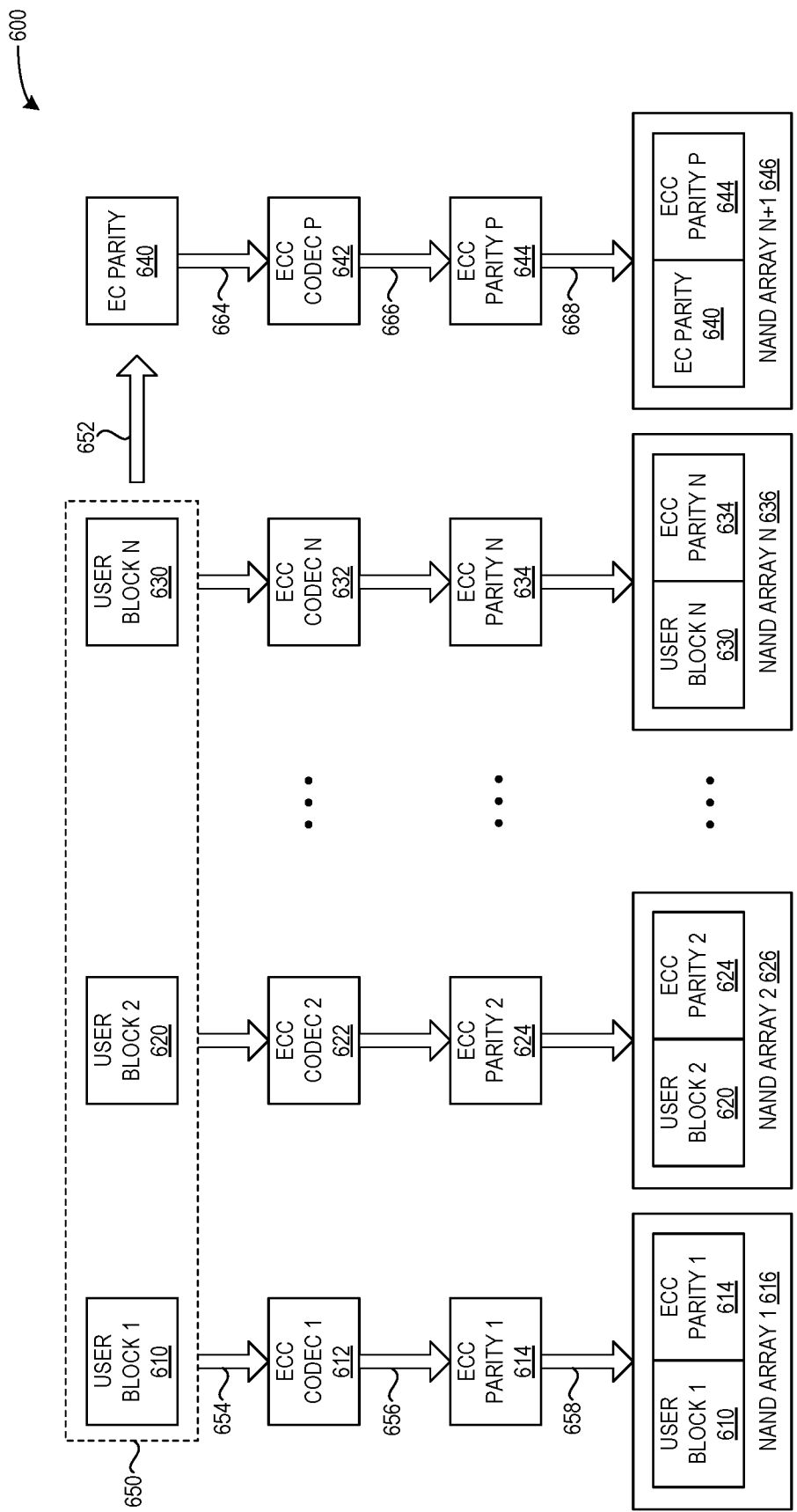
FIG. 6 illustrates an exemplary environment including erasure coding across multiple channels in a single storage device, in accordance with an embodiment of the present application.

FIG. 6 illustrates an exemplary environment 600 including erasure coding across multiple channels in a single storage device, in accordance with an embodiment of the present application. Environment 600 can include multiple channels, e.g., associated with and as indicated by multiple NAND arrays: NAND array 1 616; NAND array 2 626; NAND array N 636; and NAND array N+1 646. In environment 600, a superblock (or other type of block) 650 can include multiple chunks, blocks, or units of user data, e.g., a user block 1 610, a user block 2 620, and a user block N 630. Depicted in a vertical direction, each user block of data can be processed by an individual on-chip ECC codec residing on the NAND memory element (e.g., the NAND die) to which the respective user block of data is to be written. For example, user block 1 610 can be sent to an ECC codec 1 612 (via a communication 654), where ECC codec 1 612 can reside on a die or dies of NAND array 1 616. ECC codec 1 612 can perform an ECC encoding on user block 1 610, to obtain ECC-encoded data which includes ECC parity (bits) 1 614 (via a communication or function 656). User block 1 610 and its corresponding ECC parity 1 614 can be stored in NAND array 1 616 (via a communication or function 658).

Similarly, user block 2 620 and its corresponding ECC parity (bits) 2 624 (generated by ECC codec 2 622) can be stored in NAND array 2 626, and user block N 630 and its corresponding ECC parity (bits) N 634 (generated by ECC codec N 632) can be stored in NAND array N 636.

Furthermore, an EC encoding/decoding module (e.g., an EC codec) residing on or in the controller of the storage device can perform an EC encoding on superblock 650 (via a communication or function 652), to obtain an EC parity 640. The system can subsequently treat EC parity 640 as another chunk of user data to be written to a NAND array, similar to the user blocks 1, 2, and N described above. That is, EC parity 640 can be sent to an ECC codec P 642 (via a communication 664), where ECC codec P 642 can reside on a die or dies of NAND array N+1 646. ECC codec P 642 can perform an ECC encoding on EC parity 640, to obtain ECC-encoded data which includes ECC parity (bits) P 644 (via a communication or function 666). EC parity 640 and its corresponding ECC parity P 642 can be stored in NAND array N+1 646 (via a communication or function 668).

By placing the ECC codec into each individual NAND die, the system can reduce the congestion at the controller resulting from ECC-encoding and decoding every block or chunk of user data to be stored in non-volatile memory. Furthermore, by placing the EC codec into the controller, because the EC decoding is only triggered upon detecting an error, the system allows the EC codec to be shared across multiple channels and provides sufficient error recovery, thereby resulting in an increased lifespan and enhanced throughput for the overall storage drive or device and storage system. That is, the EC codec in a single drive can work across multiple NAND channels and collaborate with the individual ECC codecs residing on each NAND die of each channel, which results in an improved self-correction noise immunity for the high-density high-capacity NAND.

Exemplary Method for Facilitating Data Placement

Figure 7A:
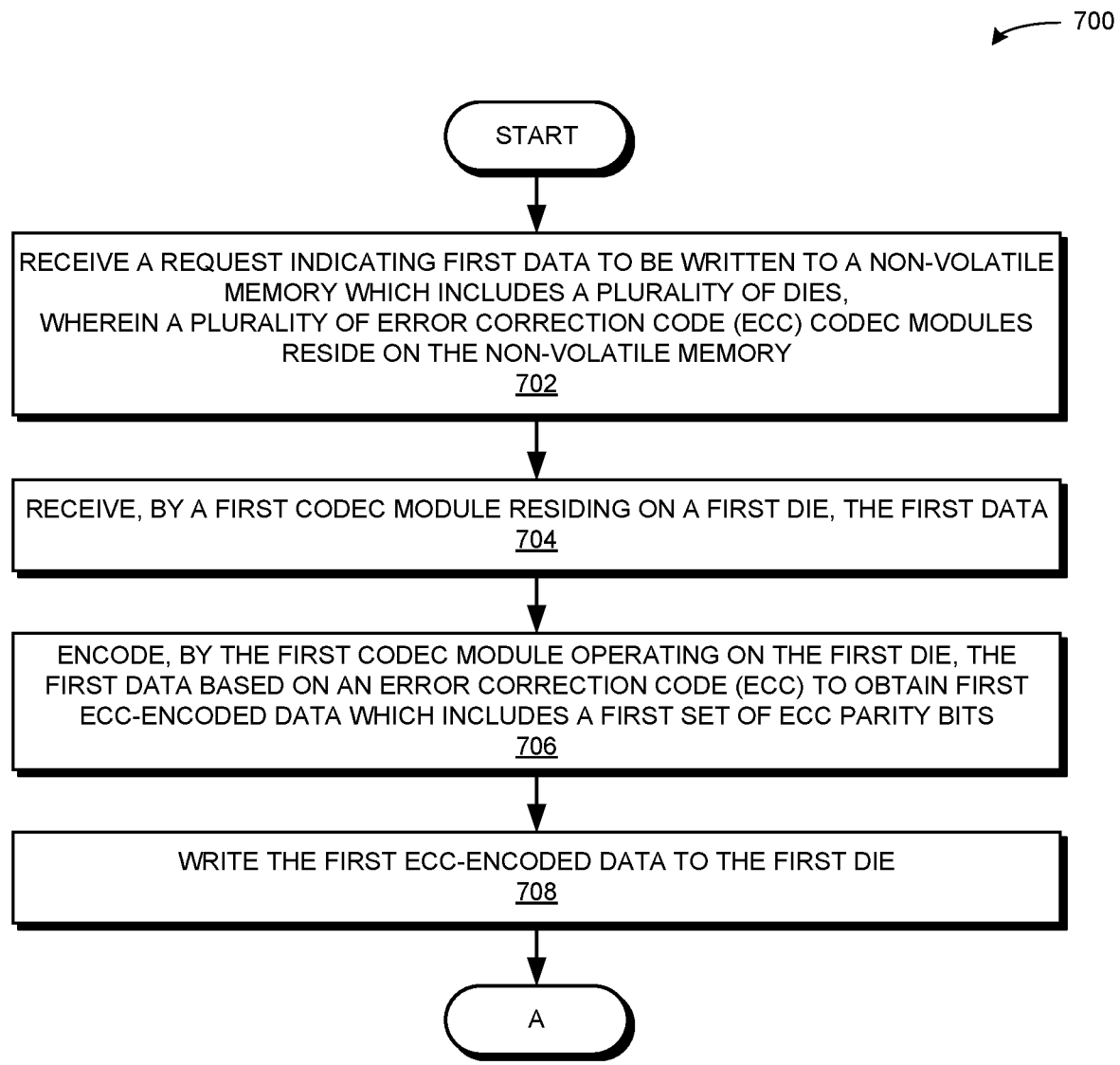
FIG. 7A presents a flowchart illustrating a method for facilitating data placement in a storage device, in accordance with an embodiment of the present application.

FIG. 7A presents a flowchart 700 illustrating a method for facilitating data placement in a storage device, in accordance with an embodiment of the present application. During operation, the system receives a request indicating first data to be written to a non-volatile memory which includes a plurality of dies, wherein a plurality of error correction code (ECC) codec modules reside on the non-volatile memory (operation 702). A respective codec module can reside on a respective die or dies. That is, a respective codec module can be shared among two or more dies or other non-volatile memory elements. The system receives, by a first codec module residing on a first die, the first data (operation 704). The system encodes, by the first codec module operating on the first die, the first data based on an error correction code (ECC) to obtain first ECC-encoded data which includes a first set of ECC parity bits (operation 706). The system writes the first ECC-encoded data to the first die (operation 708), and the operation continues at Label A of FIG. 7B.

Figure 7B:
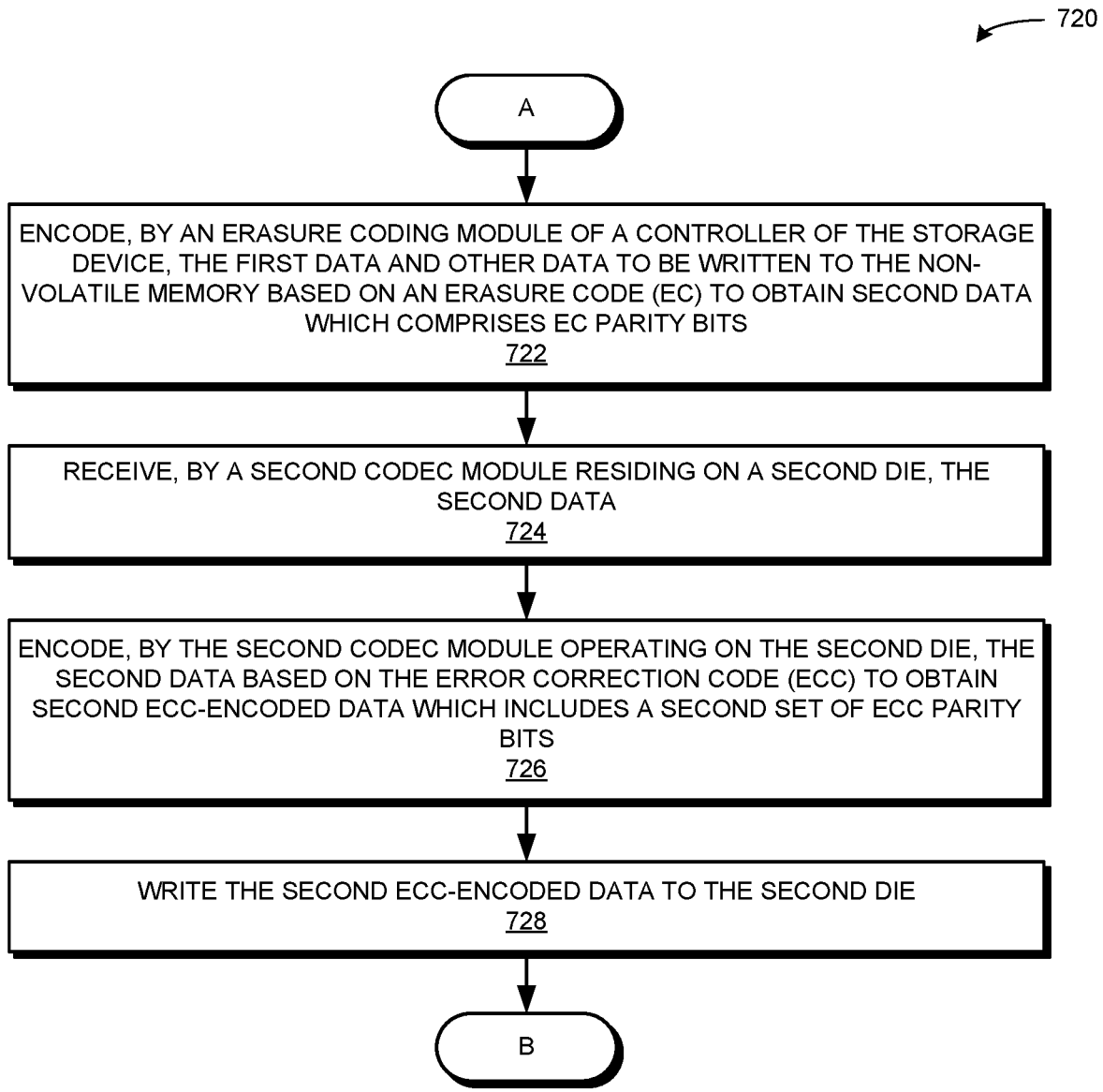
FIG. 7B presents a flowchart illustrating a method for facilitating data placement in a storage device, in accordance with an embodiment of the present application.

FIG. 7B presents a flowchart 720 illustrating a method for facilitating data placement in a storage device, in accordance with an embodiment of the present application. During operation, the system encodes, by an erasure coding module of a controller of the storage device, the first data and other data to be written to the non-volatile memory based on an erasure code (EC) to obtain second data which comprises EC parity bits (operation 722). The system receives, by a second codec module residing on a second die, the second data (operation 724). The system encodes, by the second codec module operating on the second die, the second data based on the error correction code (ECC) to obtain second ECC-encoded data which includes a second set of ECC parity bits (operation 726). The system writes the second ECC-encoded data to the second die (operation 728), and the operation continues at Label B of FIG. 7C.

Figure 7C:
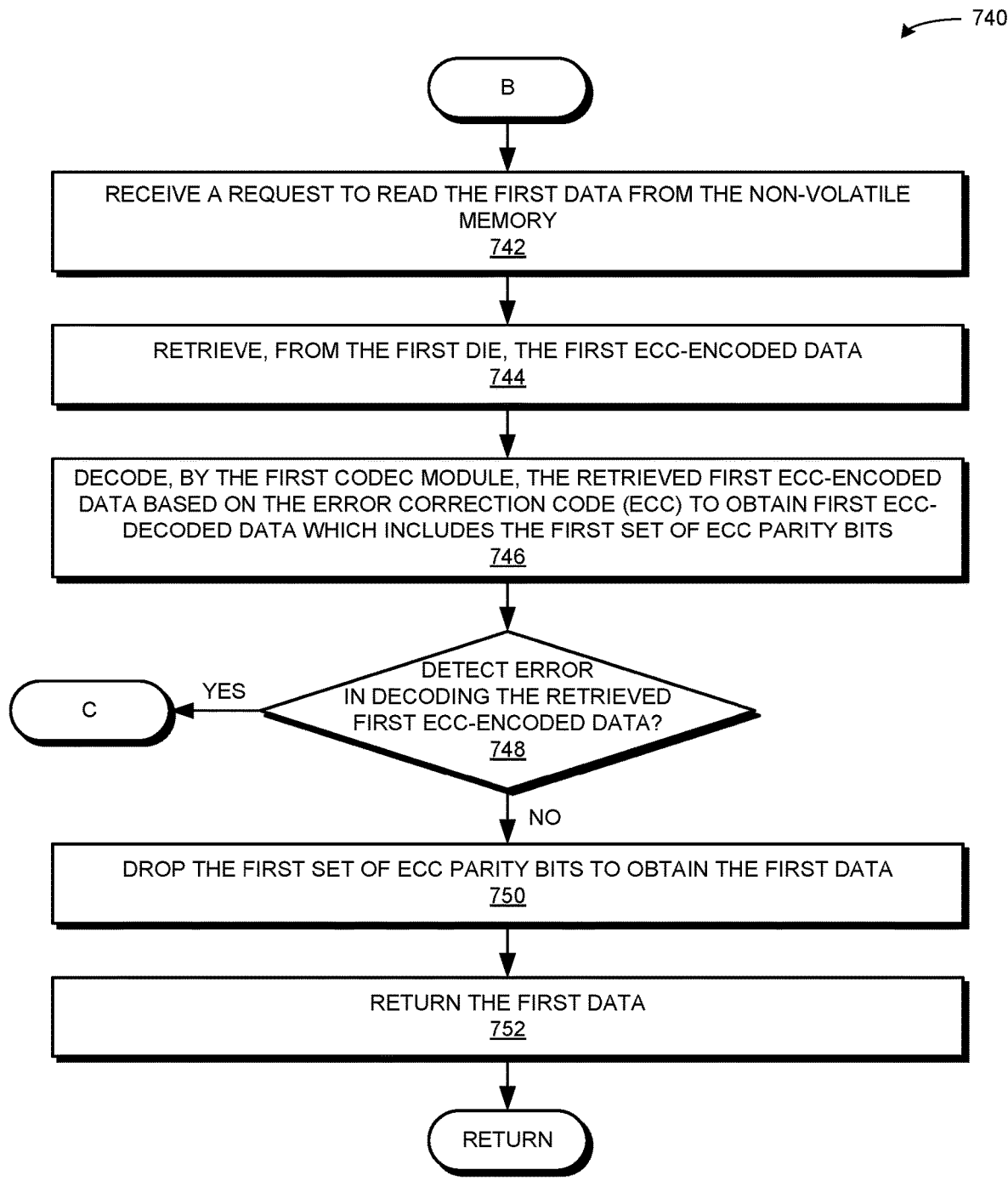
FIG. 7C presents a flowchart illustrating a method for facilitating data placement in a storage device, in accordance with an embodiment of the present application.

FIG. 7C presents a flowchart illustrating a method 740 for facilitating data placement in a storage device, in accordance with an embodiment of the present application. During operation, the system receives a request to read the first data from the non-volatile memory (operation 742). The system retrieves, from the first die, the first ECC-encoded data (operation 744). The system decodes, by the first codec module, the retrieved first ECC-encoded data based on the error correction code (ECC) to obtain first ECC-decoded data which includes the first set of ECC parity bits (operation 746). If the system detects an error in decoding the retrieved first ECC-encoded data (decision 748), the operation continues at Label C of FIG. 7D. If the system does not detect an error in decoding the retrieved first ECC-encoded data (decision 748), the system drops the first set of ECC parity bits to obtain the first data (operation 750), and returns the first data (operation 752).

Figure 7D:
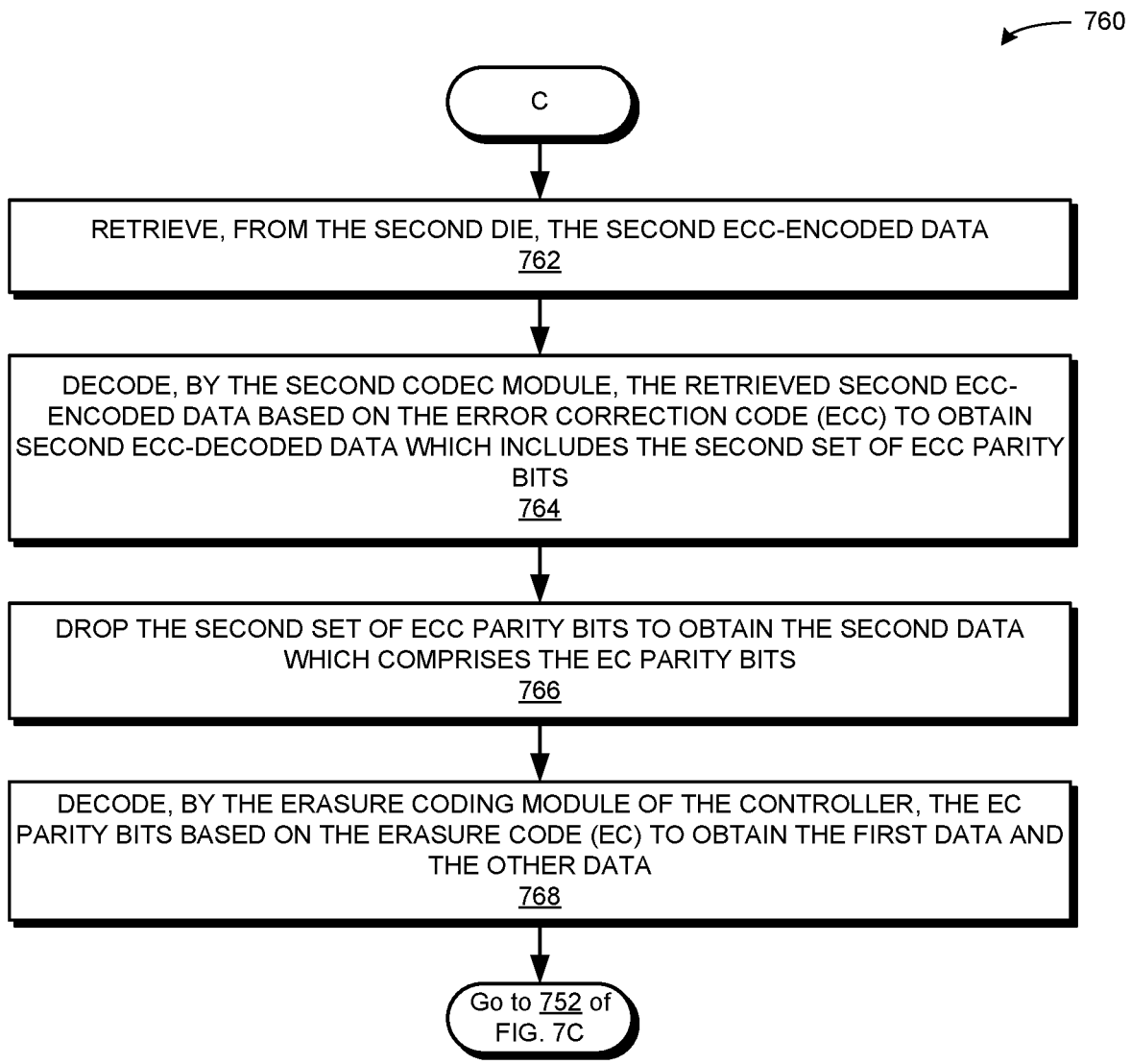
FIG. 7D presents a flowchart illustrating a method for facilitating data placement in a storage device, in accordance with an embodiment of the present application.

FIG. 7D presents a flowchart 760 illustrating a method for facilitating data placement in a storage device, in accordance with an embodiment of the present application. During operation, the system retrieves, from the second die, the second ECC-encoded data (operation 762). The system decodes, by the second codec module, the retrieved second ECC-encoded data based on the error correction code (ECC) to obtain second ECC-decoded data which includes the second set of ECC parity bits (operation 764). The system drops the second set of ECC parity bits to obtain the second data which comprises the EC parity bits (operation 766). The system decodes, by the erasure coding module of the controller, the EC parity bits based on the erasure code (EC) to obtain the first data and the other data (operation 768), and the operation continues at operation 752 of FIG. 7C.

Exemplary Computer System and Apparatus

Figure 8:
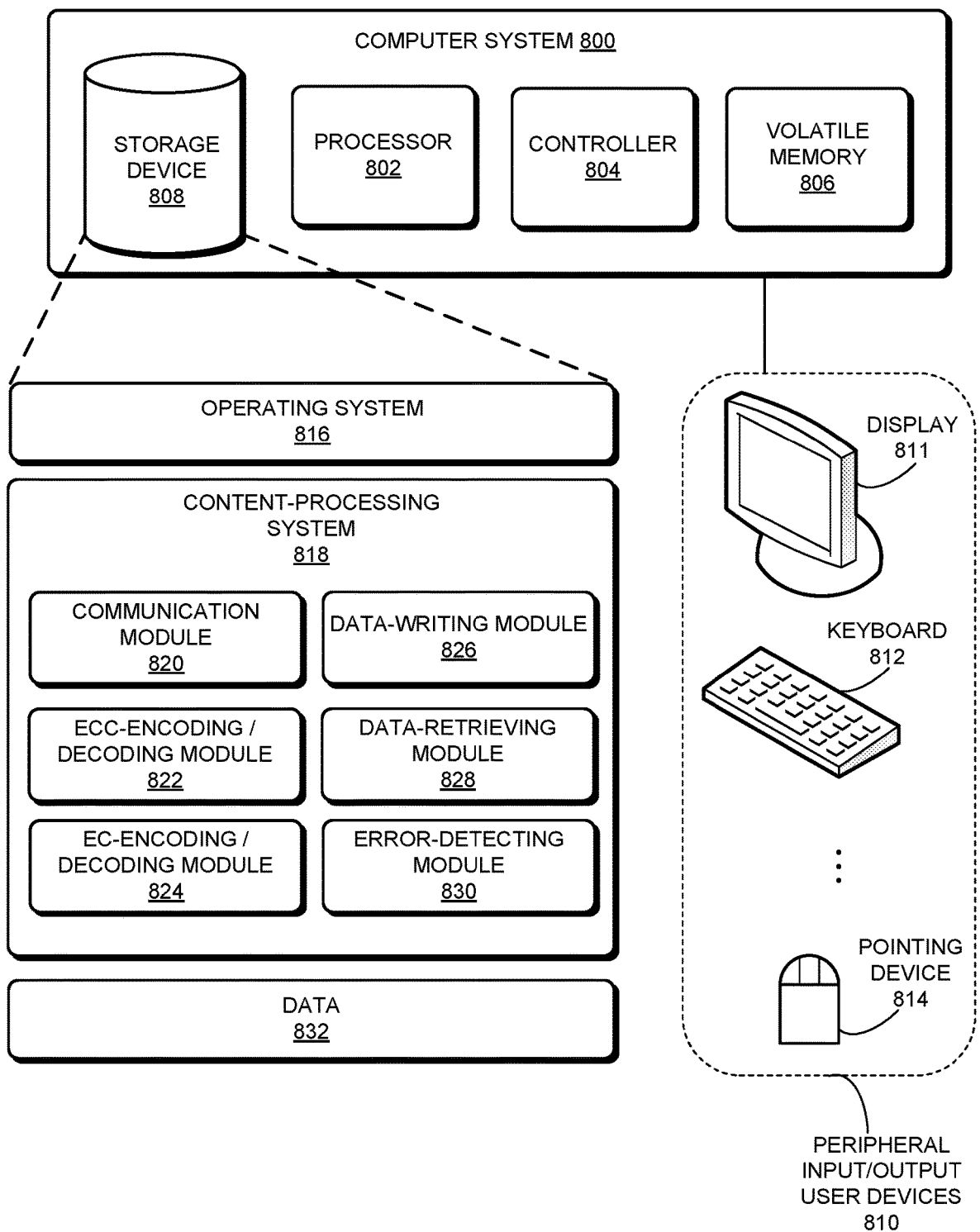
FIG. 8 illustrates an exemplary computer system that facilitates data placement in a storage device, in accordance with an embodiment of the present application.

FIG. 8 illustrates an exemplary computer system that facilitates data placement in a storage device, in accordance with an embodiment of the present application. Computer system 800 includes a processor 802, a controller 804, a volatile memory 806, and a storage device 808. Volatile memory 806 can include, e.g., random access memory (RAM), that serves as a managed memory, and can be used to store one or more memory pools. Storage device 808 can include persistent storage which can be managed or accessed via controller 804. Furthermore, computer system 800 can be coupled to peripheral input/output (I/O) user devices 810, e.g., a display device 811, a keyboard 812, and a pointing device 814. Storage device 808 can store an operating system 816, a content-processing system 818, and data 832. Storage device can also include multiple non-volatile memory elements, such as in a high-density high-capacity NAND like QLC NAND and as described above in relation to FIGS. 2-4. A non-volatile memory element of storage device 808 can comprise a NAND die, and an individual on-chip ECC codec may reside on each NAND die (not shown in FIG. 8, but as described above in relation to FIGS. 2-4).

Content-processing system 818 can include instructions, which when executed by computer system 800, can cause computer system 800 to perform methods and/or processes described in this disclosure. Specifically, content-processing system 818 can include instructions for receiving and transmitting data packets, including data to be read or written, an input/output (I/O) request (e.g., a read request or a write request), and data associated with a read request, a write request, or an I/O request (communication module 820).

Content-processing system 818 can further include instructions for receiving a request indicating first data to be written to a non-volatile memory which includes a plurality of dies, wherein a plurality of error correction code (ECC) codec modules reside on the non-volatile memory, and wherein a respective codec module resides on a respective die (communication module 820). Content-processing system 818 can include instructions for receiving, by a first codec module residing on a first die, the first data (communication module 820). Content-processing system 818 can include instructions for encoding, by the first codec module operating on the first die, the first data based on an error correction code (ECC) to obtain first ECC-encoded data which includes a first set of ECC parity bits (ECC-encoding/decoding module 822). Content-processing system 818 can include instructions for writing the first ECC-encoded data to the first die (data-writing module 826).

Content-processing system 818 can additionally include instructions for encoding, by an erasure coding module of a controller of the storage device, the first data and other data to be written to the non-volatile memory based on an erasure code (EC) to obtain second data which comprises EC parity bits (EC-encoding/decoding module 824). As described above, the EC codec can reside on a controller (e.g., controller 804, or as erasure coding codec 224 on SSD controller 220 of FIG. 2). Content-processing system 818 can include instructions for receiving, by a second codec module residing on a second die, the second data (communication module 820). Content-processing system 818 can include instructions for encoding, by the second codec module operating on the second die, the second data based on the error correction code (ECC) to obtain second ECC-encoded data which includes a second set of ECC parity bits (ECC-encoding/decoding module 822). Content-processing system 818 can include instructions for writing the second ECC-encoded data to the second die (data-writing module 826).

Content-processing system 818 can include instructions for receiving a request to read the first data from the non-volatile memory (communication module 820). Content-processing system 818 can include instructions for retrieving, from the first die, the first ECC-encoded data (data-retrieving module 828). Content-processing system 818 can include instructions for decoding, by the first codec module, the retrieved first ECC-encoded data based on the error correction code (ECC) to obtain first ECC-decoded data which includes the first set of ECC parity bits (ECC-encoding/decoding module 822). Content-processing system 818 can include instructions for dropping the first set of ECC parity bits to obtain the first data (data-retrieving module 828) and returning the first data (communication module 820).

Content-processing system 818 can include instructions for, in response to detecting an error in decoding the retrieved first ECC-encoded data (error-detecting module 830): retrieving, from the second die, the second ECC-encoded data (data-retrieving module 828); decoding, by the second codec module, the retrieved second ECC-encoded data based on the error correction code (ECC) to obtain second ECC-decoded data which includes the second set of ECC parity bits (ECC-encoding/decoding module 822); dropping the second set of ECC parity bits to obtain the second data which comprises the EC parity bits (data-retrieving module 828); and decoding, by the erasure coding module of the controller, the EC parity bits based on the erasure code (EC) to obtain the first data and the other data (EC-encoding/decoding module 824).

Data 832 can include any data that is required as input or that is generated as output by the methods and/or processes described in this disclosure. Specifically, data 832 can store at least: data; a request; a read request; a write request; an input/output (I/O) request; data associated with a read request, a write request, or an I/O request; an error correction code (ECC); an erasure code (EC); parity bits; encoded data; ECC-encoded/decoded data; ECC parity bits; EC-encoded/decoded data; EC parity bits; a logical address; a physical address associated with a write or a read operation; retrieved or returned data; an indicator of a channel, a die, a codec module, or a layer; and an indicator of a failure or an error.

Figure 9:
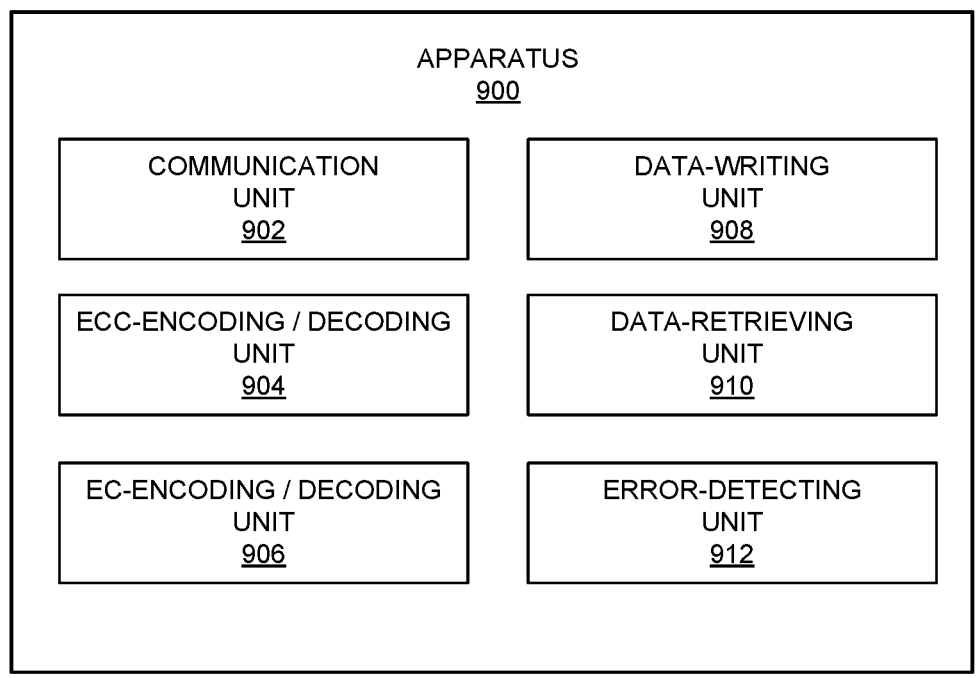
FIG. 9 illustrates an exemplary apparatus that facilitates data placement in a storage device, in accordance with an embodiment of the present application.

FIG. 9 illustrates an exemplary apparatus that facilitates data placement in a storage device, in accordance with an embodiment of the present application. Apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Further, apparatus 900 may be integrated in a computer system, or realized as a separate device which is capable of communicating with other computer systems and/or devices. Specifically, apparatus 900 can comprise units 902-912 which perform functions or operations similar to modules 820-830 of computer system 800 of FIG. 8, including: a communication unit 902; an ECC-encoding/decoding unit 904; an EC-encoding/decoding unit 906; a data-writing unit 908; a data-retrieving unit 910; and an error-detecting unit 912.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating data placement in a storage device, the method comprising:
    receiving, by a controller of the storage device from a host which performs wear-leveling, garbage collection, address-mapping, and bad block management, a request indicating first data to be written to a non-volatile memory which includes a plurality of dies and a plurality of error correction code (ECC) encoding and decoding modules residing on the plurality of dies of the storage device,
    wherein the controller includes an erasure code (EC) encoding and decoding module, and
    wherein the storage device is distinct from the host;
    receiving, by a first ECC module residing on a first die via a first interface of the controller, the first data;
    encoding, by the first ECC module operating on the first die, the first data based on an error correction code (ECC) to obtain first ECC-encoded data which includes a first set of ECC parity bits; and
    writing the first ECC-encoded data to the first die;
    encoding, by the EC module of the controller of the storage device, the first data and other data to be written to the non-volatile memory based on an erasure code (EC) to obtain second data which comprises EC parity bits;
    receiving, by a second ECC module residing on a second die via the first interface, the second data;
    encoding, by the second ECC module operating on the second die, the second data based on the error correction code (ECC) to obtain second ECC-encoded data which includes a second set of ECC parity bits; and
    writing the second ECC-encoded data to the second die.

2. The method of claim 1, wherein the first data and the other data comprise a superblock of the non-volatile memory.

3. The method of claim 1, further comprising:
    receiving a request to read the first data from the non-volatile memory;
    retrieving, from the first die, the first ECC-encoded data;
    decoding, by the first codec module, the retrieved first ECC-encoded data based on the error correction code (ECC) to obtain first ECC-decoded data which includes the first set of ECC parity bits;
    dropping the first set of ECC parity bits to obtain the first data; and
    returning the first data.

4. The method of claim 3, wherein in response to detecting an error in decoding the retrieved first ECC-encoded data, the method further comprises:
    retrieving, from the second die, the second ECC-encoded data;
    decoding, by the second codec module, the retrieved second ECC-encoded data based on the error correction code (ECC) to obtain second ECC-decoded data which includes the second set of ECC parity bits;
    dropping the second set of ECC parity bits to obtain the second data which comprises the EC parity bits; and
    decoding, by the erasure coding module of the controller, the EC parity bits based on the erasure code (EC) to obtain the first data and the other data.

5. The method of claim 1,
    wherein the storage device comprises a plurality of channels,
    wherein a respective channel is associated with a respective die, and
    wherein the first codec module receives the first data via a first channel associated with the first die.

6. The method of claim 1, wherein a respective die comprises a NAND flash memory element and further comprises:
    a plurality of layers, including a peripheral layer stacked above a remainder of the plurality of layers,
    wherein a respective codec module resides on the peripheral layer, and
    wherein the remainder layers form a staircase-shape which routes wordlines to the peripheral layer and the respective codec module.

7. The method of claim 1, wherein a respective ECC encoding and decoding module resides on a respective die or dies.

8. A computer system for facilitating error recovery, the system comprising:
    a processor; and
    a memory coupled to the processor and storing instructions, which when executed by the processor cause the processor to perform a method, wherein the computer system comprises a storage device, the method comprising:
    receiving, by a controller of the storage device from a host which performs wear-leveling, garbage collection, address-mapping, and bad block management, a request indicating first data to be written to a non-volatile memory which includes a plurality of dies and a plurality of error correction code (ECC) encoding and decoding modules residing on the plurality of dies of the storage device,
    wherein the controller includes an erasure code (EC) encoding and decoding module, and
    wherein the storage device is distinct from the host;
    receiving, by a first ECC module residing on a first die via a first interface of the controller, the first data;
    encoding, by the first ECC module operating on the first die, the first data based on an error correction code (ECC) to obtain first ECC-encoded data which includes a first set of ECC parity bits; and
    writing the first ECC-encoded data to the first die;
    encoding, by the EC module of the controller of the storage device, the first data and other data to be written to the non-volatile memory based on an erasure code (EC) to obtain second data which comprises EC parity bits;
    receiving, by a second ECC module residing on a second die via the first interface, the second data;

encoding, by the second ECC module operating on the second die, the second data based on the error correction code (ECC) to obtain second ECC-encoded data which includes a second set of ECC parity bits; and writing the second ECC-encoded data to the second die.

9. The computer system of claim 8, wherein the first data and the other data comprise a superblock of the non-volatile memory.

10. The computer system of claim 8, wherein the method further comprises:
receiving a request to read the first data from the non-volatile memory;
retrieving, from the first die, the first ECC-encoded data;
decoding, by the first codec module, the retrieved first ECC-encoded data based on the error correction code (ECC) to obtain first ECC-decoded data which includes the first set of ECC parity bits;
dropping the first set of ECC parity bits to obtain the first data; and
returning the first data.

11. The computer system of claim 10, wherein in response to detecting an error in decoding the retrieved first ECC-encoded data, the method further comprises:
retrieving, from the second die, the second ECC-encoded data;
decoding, by the second codec module, the retrieved second ECC-encoded data based on the error correction code (ECC) to obtain second ECC-decoded data which includes the second set of ECC parity bits;
dropping the second set of ECC parity bits to obtain the second data which comprises the EC parity bits; and
decoding, by the erasure coding module of the controller, the EC parity bits based on the erasure code (EC) to obtain the first data and the other data.

12. The computer system of claim 8,
wherein the storage device comprises a plurality of channels,
wherein a respective channel is associated with a respective die, and
wherein the first codec module receives the first data via a first channel associated with the first die.

13. The computer system of claim 8, wherein a respective die comprises a NAND flash memory element and further comprises:
a plurality of layers, including a peripheral layer stacked above a remainder of the plurality of layers,
wherein a respective codec module resides on the peripheral layer, and
wherein the remainder layers form a staircase-shape which routes wordlines to the peripheral layer and the respective codec module.

14. The computer system of claim 8, wherein a respective ECC encoding and decoding module resides on a respective die or dies.

15. A non-transitory computer-readable storage medium storing instructions that when executed by a computer cause the computer to perform a method, the method comprising:
receiving, by a controller of a storage device from a host which performs wear-leveling, garbage collection, address-mapping, and bad block management, a request indicating first data to be written to a non-volatile memory which includes a plurality of dies and a plurality of error correction code (ECC) encoding and decoding modules residing on the plurality of dies of the storage device,
wherein the controller includes an erasure code (EC) encoding and decoding module, and wherein the storage device is distinct from the host;
receiving, by a first ECC module residing on a first die via a first interface of the controller, the first data;
encoding, by the first ECC module operating on the first die, the first data based on an error correction code (ECC) to obtain first ECC-encoded data which includes a first set of ECC parity bits; and
writing the first ECC-encoded data to the first die;
encoding, by the EC module of the controller of the storage device, the first data and other data to be written to the non-volatile memory based on an erasure code (EC) to obtain second data which comprises EC parity bits;
receiving, by a second ECC module residing on a second die via the first interface, the second data;
encoding, by the second ECC module operating on the second die, the second data based on the error correction code (ECC) to obtain second ECC-encoded data which includes a second set of ECC parity bits; and
writing the second ECC-encoded data to the second die.

16. The non-transitory computer-readable storage medium of claim 15, wherein the first data and the other data comprise a superblock of the non-volatile memory.

17. The non-transitory computer-readable storage medium of claim 15, wherein the method further comprises:
receiving a request to read the first data from the non-volatile memory;
retrieving, from the first die, the first ECC-encoded data;
decoding, by the first codec module, the retrieved first ECC-encoded data based on the error correction code (ECC) to obtain first ECC-decoded data which includes the first set of ECC parity bits;
dropping the first set of ECC parity bits to obtain the first data; and
returning the first data.

18. The non-transitory computer-readable storage medium of claim 17, wherein in response to detecting an error in decoding the retrieved first ECC-encoded data, the method further comprises:
retrieving, from the second die, the second ECC-encoded data;
decoding, by the second codec module, the retrieved second ECC-encoded data based on the error correction code (ECC) to obtain second ECC-decoded data which includes the second set of ECC parity bits;
dropping the second set of ECC parity bits to obtain the second data which comprises the EC parity bits; and
decoding, by the erasure coding module of the controller, the EC parity bits based on the erasure code (EC) to obtain the first data and the other data.

19. The non-transitory computer-readable storage medium of claim 15,
wherein the storage device comprises a plurality of channels,
wherein a respective channel is associated with a respective die, and
wherein the first codec module receives the first data via a first channel associated with the first die.

20. The non-transitory computer-readable storage medium of claim 15, wherein a respective ECC encoding and decoding module resides on a respective die or dies.

* * * * *